United States Patent
Roset et al.

(10) Patent No.: US 10,599,049 B2
(45) Date of Patent: Mar. 24, 2020

(54) SUBSTRATE HOLDER, A LITHOGRAPHIC APPARATUS AND METHOD OF MANUFACTURING DEVICES

(71) Applicant: ASML Netherlands B.V., Veldhoven (NL)

(72) Inventors: Bas Johannes Petrus Roset, Eindhoven (NL); Siegfried Alexander Tromp, Knegsel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/761,245

(22) PCT Filed: Aug. 24, 2016

(86) PCT No.: PCT/EP2016/069940
§ 371 (c)(1),
(2) Date: Mar. 19, 2018

(87) PCT Pub. No.: WO2017/054991
PCT Pub. Date: Apr. 6, 2017

(65) Prior Publication Data
US 2018/0259855 A1    Sep. 13, 2018

(30) Foreign Application Priority Data
Sep. 28, 2015  (EP) ..................................... 15187184

(51) Int. Cl.
*G03B 27/60* (2006.01)
*G03F 7/20* (2006.01)

(52) U.S. Cl.
CPC .......... *G03F 7/707* (2013.01); *G03F 7/70783* (2013.01)

(58) Field of Classification Search
CPC ..... H01L 21/683–6833; H01L 21/6838; H01L 21/687; H01L 21/68714; H01L 21/68735;
(Continued)

(56) References Cited

U.S. PATENT DOCUMENTS 5,923,408 A * 7/1999 Takabayashi ........... G03F 7/707
269/21
6,762,826 B2 * 7/2004 Tsukamoto ............. G03F 7/707
355/53
(Continued)

FOREIGN PATENT DOCUMENTS

EP     0803904 A2    10/1997
JP     H01-129438 A   5/1989
(Continued)

OTHER PUBLICATIONS

International Search Report and Written Opinion of the International Searching Authority directed to related International Patent Application No. PCT/EP2016/069940, dated Jun. 4, 2017; 11 pages.
(Continued)

*Primary Examiner* — Christina A Riddle
(74) *Attorney, Agent, or Firm* — Sterne, Kessler, Goldstein & Fox P.L.L.C.

(57) ABSTRACT

A substrate holder (WT) for use in a lithographic apparatus and configured to support a substrate, the substrate holder comprising: a main body (20) having a main body surface; and a plurality of burls (21) projecting from the main body surface; wherein each burl has a distal end configured to engage with the substrate; the distal ends of the burls substantially conform to a support plane whereby a substrate can be supported in a substantially flat state on the burls; and a flow control feature (22, 22c, 22d) configured to form a gas cushion adjacent the periphery of the substrate holder when a substrate is being lowered onto the substrate holder.

12 Claims, 5 Drawing Sheets

(58) Field of Classification Search
CPC .......... H01L 21/6875; H01L 21/68742; H01L 21/68785; G03F 7/707; G03F 7/70708; G03F 7/70716; G03F 7/70783; G03F 7/708; G03F 7/70825; G03F 7/70858; G03F 7/70866; G03F 7/70875; G03F 7/70908; G03F 7/70916; G03F 7/70925; G03F 7/70933
USPC ............ 355/30, 52, 53, 55, 72–74, 77; 250/492.1, 492.2, 492.22, 493.1
See application file for complete search history.

(56) References Cited

U.S. PATENT DOCUMENTS

| | | | |
|---|---|---|---|
| 7,133,120 | B2 | 11/2006 | Zaal et al. |
| 2004/0036850 | A1 | 2/2004 | Tsukamoto et al. |
| 2005/0195382 | A1 | 9/2005 | Ottens et al. |
| 2006/0216025 | A1 | 9/2006 | Kihara et al. |
| 2007/0115450 | A1* | 5/2007 | Nagasaka ........... G03F 7/70341 355/72 |
| 2007/0152690 | A1 | 7/2007 | Sung |
| 2009/0086187 | A1* | 4/2009 | Compen ................ G03F 7/707 355/73 |
| 2016/0133504 | A1* | 5/2016 | Chu ................ H01L 21/67115 165/146 |
| 2016/0370712 | A1 | 12/2016 | Shibazaki |

FOREIGN PATENT DOCUMENTS

| | | |
|---|---|---|
| JP | 2001-060617 A | 3/2001 |
| JP | 2005-191557 A | 7/2005 |
| JP | 2005-277117 A | 10/2005 |
| JP | 2005-328045 A | 11/2005 |
| JP | 2010-530636 A | 9/2010 |
| JP | 2010-531541 A | 9/2010 |
| JP | 2012-237817 A | 12/2012 |
| JP | 2016-111343 A | 6/2016 |
| WO | WO 2008/156366 A1 | 12/2008 |
| WO | WO 2008/156367 A1 | 12/2008 |
| WO | WO 2015/064613 A1 | 5/2015 |

OTHER PUBLICATIONS

International Preliminary Report on Patentability directed to related International Patent Application No. PCT/EP2016/069940, dated Jun. 4, 2017; 8 pages.

* cited by examiner

SUBSTRATE HOLDER, A LITHOGRAPHIC APPARATUS AND METHOD OF MANUFACTURING DEVICES

CROSS REFERENCE TO RELATED APPLICATIONS

This application claims priority of EP application 15187184.5 which was filed on 2015 Sep. 28 and which is incorporated herein in its entirety by reference.

FIELD

The present invention relates to a substrate holder, a lithographic apparatus using the substrate holder and a method of making devices using the substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final optical element of the projection system and the substrate. In an embodiment, the liquid is distilled water, although another liquid can be used. The point of this is to enable imaging of smaller features since the exposure radiation will have a shorter wavelength in the liquid. The effect of the liquid may also be regarded as increasing the effective numerical aperture (NA) of the system and also increasing the depth of focus.

The substrate is conventionally clamped to a substrate holder during exposures. Two clamping techniques are commonly used. In vacuum clamping a pressure differential across the substrate is established, e.g. by connecting the space between the substrate to an under-pressure, so that a higher pressure above the substrate exerts a force holding the substrate to the substrate holder. In electrostatic clamping, electrostatic forces are used to exert a force between the substrate and the substrate holder. Several different arrangements are known to achieve this. In one arrangement a first electrode is provided on the lower surface of the substrate and a second electrode on the upper surface of the substrate holder. A potential difference is established between the first and second electrodes. In another arrangement two semi-circular electrodes are provided on the substrate holder and a conductive layer is provided on the substrate. A potential (voltage) difference is applied between the two semi-circular electrodes so that the two semi-circular electrodes and the conductive layer on the substrate act like two capacitors in series.

A substrate holder conventionally has a plurality of burls to support the substrate. The total area of the burls that contacts the substrate is small compared to the total area of a substrate. Therefore, the chance that a contaminant particle randomly located on the surface of the substrate or the substrate holder is trapped between a burl and the substrate is small. Also, in manufacture of the substrate holder, it is easier to make the tops of the burls accurately coplanar, than to make a large surface accurately flat.

To load a substrate onto a substrate holder in preparation for exposure it is placed by a substrate handler robot onto so-called e-pins which project through the substrate holder. The e-pins then retract to lower the substrate onto the substrate holder. Then, the clamping force is applied so that the substrate is held very firmly during exposure. The clamping force is large enough to hold the substrate in position even when it is subjected to very large accelerations and to resist thermal expansion, for example due to absorption of energy from the projection beam during exposure. If the substrate is distorted, e.g. so as to be convex, the clamping force will tend to flatten out the substrate against the substrate holder.

SUMMARY

It is desirable, for example, to provide an improved substrate holder that can better handle distorted substrates.

According to an aspect of the invention, there is provided a substrate holder for use in a lithographic apparatus and configured to support a substrate, the substrate holder comprising:
 a main body having a main body surface;
 a plurality of burls projecting from the main body surface; wherein
  each burl has a distal end configured to engage with the substrate;
  the distal ends of the burls substantially conform to a support plane whereby a substrate can be supported in a substantially flat state on the burls; and
 a flow control feature configured to form a gas cushion adjacent the periphery of the substrate holder when a substrate is being lowered onto the substrate holder.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
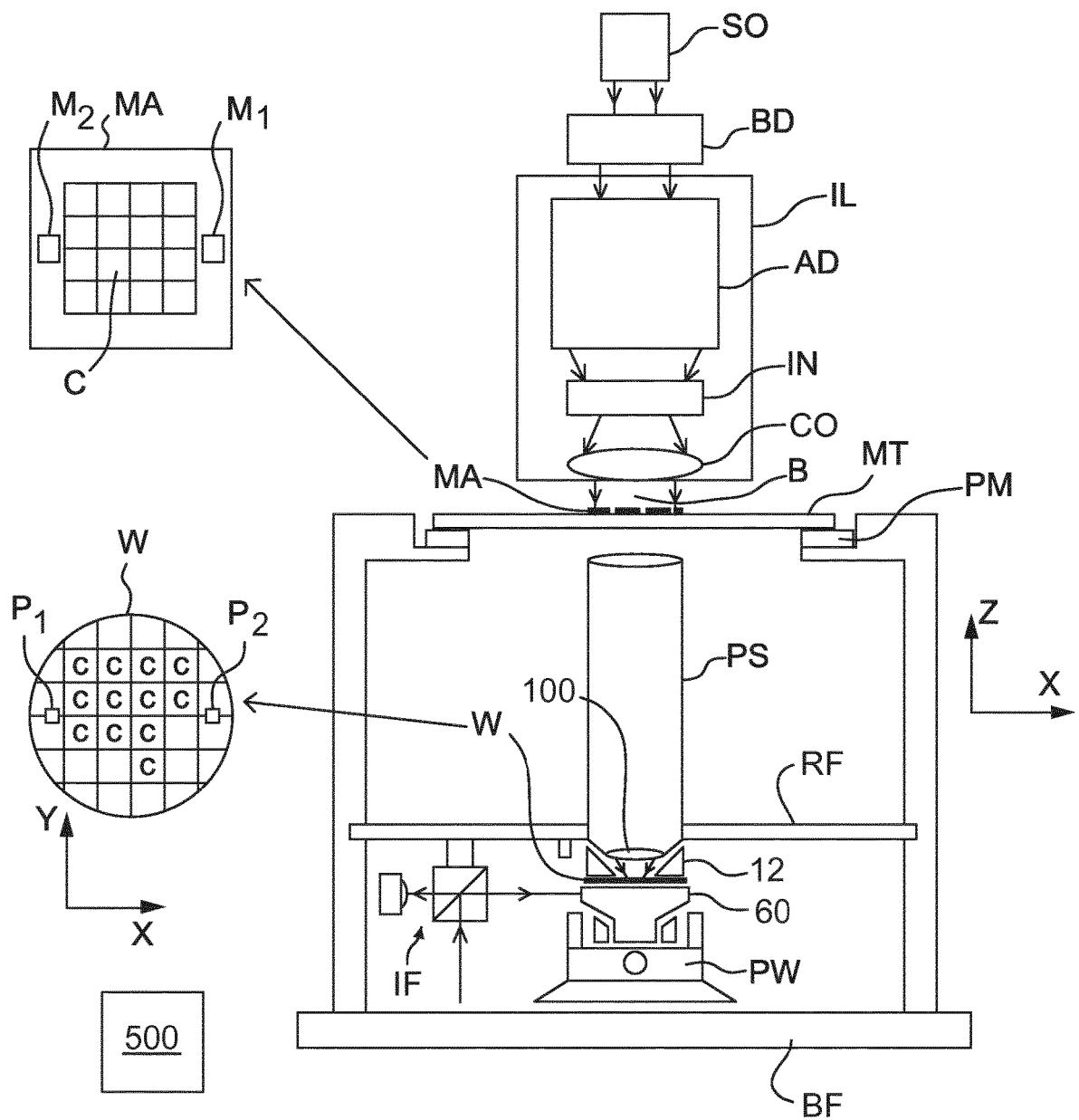
FIG. 1 schematically depicts a lithographic apparatus.

FIG. 1 schematically depicts a lithographic apparatus of an embodiment of the invention. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate support apparatus 60 constructed to hold a substrate (e.g. a resist-coated production substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables. The lithographic apparatus may be of a type that has a measurement station, at which there are various sensors for characterizing a production substrate prior to exposure and an exposure station, at which the exposures are carried out.

The lithographic apparatus is of a type wherein at least a portion of the substrate W may be covered by a immersion liquid 10 having a relatively high refractive index, e.g. water such as ultra pure water (UPW), so as to fill an immersion space 11 between the projection system PS and the substrate W. An immersion liquid 10 may also be applied to other spaces in the lithography apparatus, for example, between the patterning device MA and the projection system PS Immersion techniques can be used to increase the numerical aperture of projection systems. The term "immersion" as used herein does not mean that a structure, such as a substrate W, must be submerged in immersion liquid 10; rather "immersion" only means that an immersion liquid 10 is located between the projection system PS and the substrate W during exposure. The path of the patterned radiation beam B from the projection system PS to the substrate W is entirely through immersion liquid 10.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as G-outer and G-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g. mask) MA, which is held on the support structure (e.g. mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW.

In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the patterning device alignment marks M1, M2 may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de-) magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam B is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

Arrangements for providing immersion liquid between a final optical element of the projection system PS and the substrate W can be classed into three general categories. These are the bath type arrangement, the so-called localized immersion systems and the all-wet immersion systems. An embodiment of the present invention relates particularly to the localized immersion systems.

To load a substrate onto the substrate support apparatus 60 for exposures, it is picked up by a substrate handler robot and lowered onto a set of e-pins which project through the substrate holder. The e-pins are actuated so that they can extend and retract and they may be provided with suction openings at their tips to grip the substrate. There may be three e-pins spaced around the center of the substrate holder. Once the substrate has settled on the e-pins, the e-pins are retracted so that the substrate is lowered onto and supported by burls of the substrate holder. A clamp system is activated to clamp the substrate to the substrate holder. The clamp system may be activated before the substrate has contacted the substrate holder. These steps are conventionally performed at a load/unload station.

Ideally the substrate is perfectly flat, but inevitably some distortion can occur and it is desirable that the lithographic apparatus achieves acceptable performance with distorted substrates. In some cases a less strict performance measure applies when a distorted substrate is exposed. For example, a greater overlay error may be allowed when the substrate curvature is greater than a specified amount. Nevertheless, it is desirable to improve the performance of the lithographic apparatus even for distorted substrates.

Distorted substrates commonly fall into two types, which are sometimes referred to as "bowl substrates" and "umbrella substrates". A bowl substrate is curved upward at the edges, i.e. the surface on which exposures are to be performed is concave, like a bowl. An umbrella substrate is curved downward at the edges, i.e. the surface on which exposures are to be performed is convex, like an umbrella. If a substrate is to be exposed on both sides, its orientation, when loaded into the lithographic apparatus, determines whether it is a bowl or umbrella substrate. A flat substrate may initially distort under its own weight while being held by the e-pins, e.g. becoming an umbrella substrate, but may distort differently when being lowered.

Investigations and simulations performed by the present inventors have determined that differently distorted and flat substrates behave differently when loaded onto the substrate holder and clamped, leading to undesirable differences when exposed. For example, overlay errors may vary significantly between substrates. Such substrate-to-substrate variation is particularly undesirable as it is difficult to predict and to compensate for. An overlay error that is consistent between substrates can often be compensated for, e.g. by adjusting the position of the substrate during exposure.

The inventors' investigations reveal that as an umbrella substrate is lowered onto the burls of the substrate it will contact the burls that are near the edge before it contacts the burls that are near the center. Friction between the burls and the lower surface of the substrate may then prevent the substrate to fully relax into a flat, unstressed state. If a delay is introduced to allow the substrate to relax fully before the substrate clamping system is activated then this reduces throughput. The umbrella substrates are therefore compressed in-plane. The amount of in-plane compression may be small in absolute terms but is significant given the extremely tight overlay error budgets for high resolution lithography.

The inventors' investigations also reveal that as a flat or bowl substrate is lowered onto the burls of the substrate it will contact the burls that are near the center before it contacts the burls that are near the edge. As the clamping force is applied, the substrate tends to be expanded in-plane. The amount of expansion may be small in absolute terms but is significant given the extremely tight overlay error budgets for high resolution lithography. Initially flat substrates also tend to experience in-plane expansion. Thus the distortions occurring to compressed umbrella substrates and expanded flat substrates add to give a greater substrate-to-substrate variation.

According to the present invention there is proposed a substrate holder for use in a lithographic apparatus and configured to support a substrate, the substrate holder comprising:

a main body having a main body surface;
a plurality of burls projecting from the main body surface; wherein
each burl has a distal end configured to engage with the substrate;
the distal ends of the burls substantially conform to a support plane whereby a substrate can be supported in a substantially flat state on the buds; and
a flow control feature configured to form a gas cushion adjacent the periphery of the substrate holder when a substrate is being lowered onto the substrate holder.

The flow control feature causes a build-up of gas adjacent the periphery of the substrate as the substrate is being lowered onto the substrate holder. In other words, the pressure underneath the periphery of the substrate increases. This pressure increase delays the descent of the periphery of the substrate, especially if the substrate is an umbrella substrate, so that it touches down on the burls more nearly simultaneously across the whole area of the substrate. This reduces or eliminates the compression effect that occurs when umbrella substrates are clamped to the substrate holder. With a substrate holder according to the invention, umbrella substrates behave more like flat substrates and at least substrate-to-substrate overlay differences are reduced.

An additional advantage of the invention is that the flow control feature improves thermal coupling between the substrate and the substrate holder in the peripheral region. This improves temperature control of the substrate.

In an embodiment, the flow control feature comprises a raised area adjacent the periphery of the substrate holder.

The raised area can easily be provided in manufacture of the substrate holder and can be shaped to have the desired effect.

In an embodiment, the raised area is in the form of a ring around substantially the whole periphery of the substrate holder.

By providing the raised area in the form of a ring, a substantially uniform and rotationally symmetric effect can be achieved.

In an embodiment, the raised area has a width in the radial direction of the substrate holder in the range of from 2 mm to 80 mm, desirably 10 mm to 50 mm.

With a width in this range, a suitable gas cushion effect can be achieved for umbrella substrates of commonly occurring degrees of distortion. If the raised area does not have clearly defined boundaries, the width of the raised area should be regarded as the radial distance between the radially innermost part of the raised area that is no more than 50 μm below the support plane and the radially outermost part of the raised area that is no more than 50 μm below the support plane.

In an embodiment, the raised area has a distal surface and the distance between the distal surface and the support plane is at least 3 μm.

A spacing of 3 μm or more between the top of the raised area and the support plane ensures that if a contaminant particle falls onto the raised area it does not cause a distortion of the substrate.

In an embodiment, the raised area has a distal surface and the distance between the distal surface and the support plane is no more than 50 μm.

A spacing of 50 μm or less between the top of the raised area and the support plane helps to ensure the gas cushion effect is effective.

In an embodiment, the raised area has a distal surface and the distal surface is substantially parallel to the support plane.

If the distal surface is parallel to the support plane, the gas cushion is effective.

In an embodiment, the raised area has a distal surface and the distal surface is inclined to the support plane so that the distance between the distal surface and the support plane at a radially inner part thereof is less than a distance between the distal surface and the support plane at a radially an outer part thereof.

If the distal surface is inclined toward the outside, then an inward flow of gas, caused by extraction of gas through a vacuum clamp system, easily generates a gas cushion. It is also possible that the distal surface is inclined towards the inside.

In an embodiment, the raised area has a distal surface and the distal surface is concave.

A concavity on the distal surface assists in retaining gas to form a gas cushion.

In an embodiment, there is also a seal structure radially outward of the flow control structure.

The seal structure outside the flow control structure forms a narrow gap to the substrate when loaded so as to reduce the gas flow required to maintain an under-pressure below the substrate for clamping.

In an embodiment, a distance between a distal seal surface of the seal structure and the support plane is less than a distance between the distal surface of the flow control structure and the support plane.

The seal structure can be much narrower than the flow control structure so that the gap between the distal seal surface and the support plane can be small without an unacceptable risk of a contaminant particle being trapped.

According to an embodiment of the invention, there is also provided a lithographic apparatus for projecting an image onto a substrate, the lithographic apparatus comprising:

a substrate holder as described above; and a clamp system for clamping a substrate to the substrate holder.

According to an embodiment of the invention, there is also provided a method of manufacturing devices using a lithographic apparatus having a substrate holder as described above and a clamp system for clamping a substrate to the substrate holder, the method comprising:

loading a substrate onto the substrate holder;
engaging the clamp system; and
exposing a pattern onto the substrate.

Figure 2:
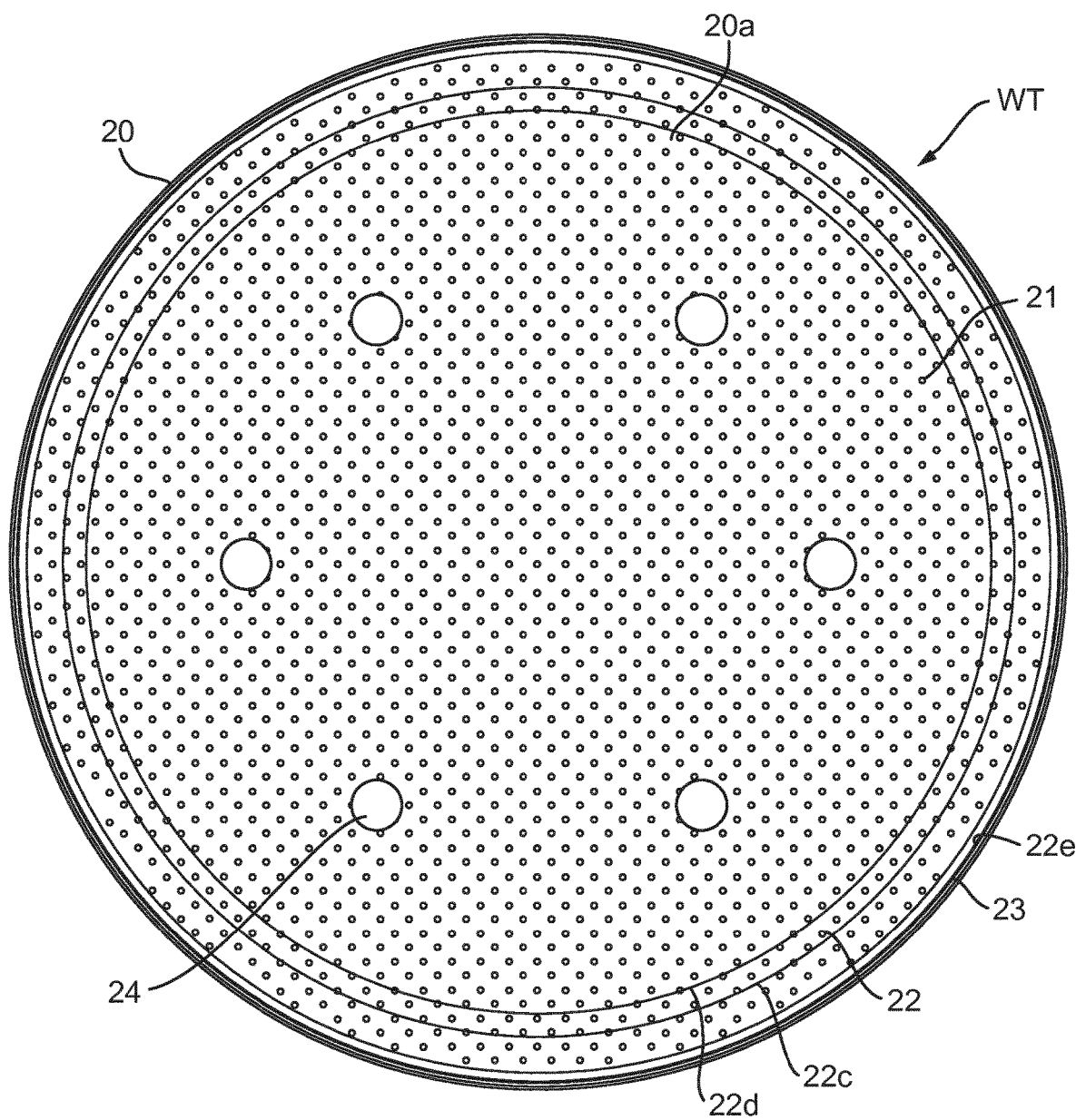
FIG. 2 depicts in plan a substrate holder according to an embodiment.

FIG. 2 depicts a substrate holder WT according to an embodiment of the present invention. Substrate holder WT comprises a main body 20 that is generally circular in plan. Main body 20 desirably has a diameter equal to the diameter of the substrates which are to be supported. The diameter of main body 20 may be, for example, 300 mm or 450 mm. Main body 20 has a main body upper surface 20a that is generally flat, save as described below, Main body upper surface 20a is provided with a plurality of burls 21 projecting therefrom. The distal end surfaces of burls 21 accurately conform to a support plane SP so as to support a substrate. In other words, the distal end surfaces of burls 21 are coplanar.

Figure 3:
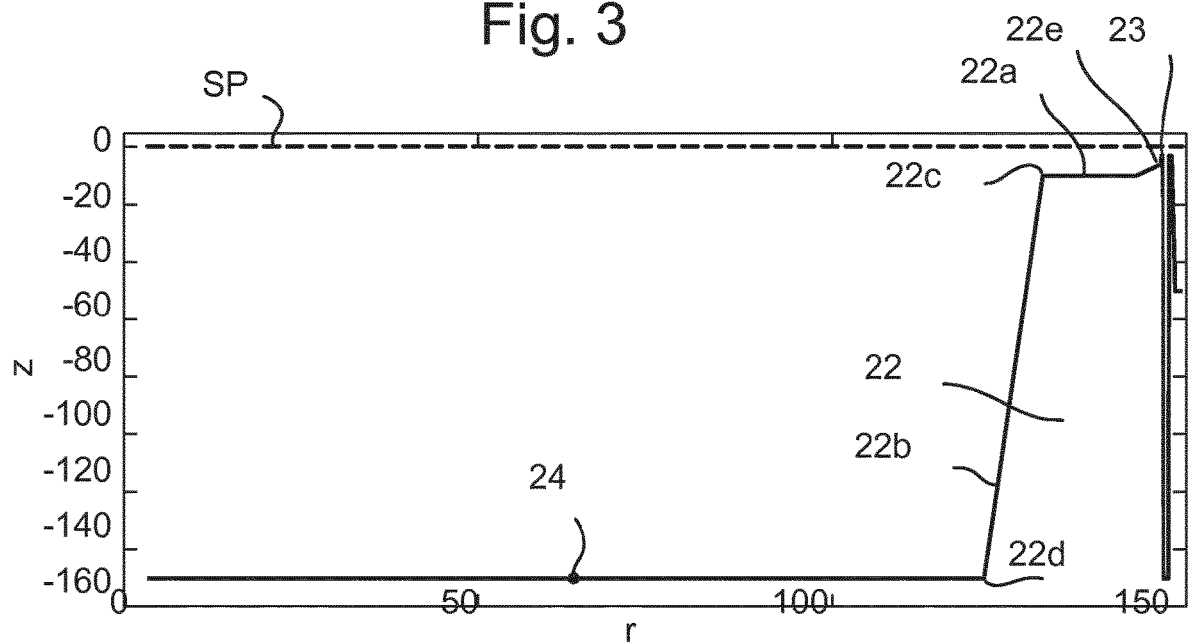
FIG. 3 is a graph depicting the height of a surface of a substrate holder according to an embodiment along a radius thereof.

Around the periphery of substrate holder WT, there is a flow control structure 22, which is described further below. Outside of flow control structure 22 there is a seal structure 23. The flow control structure and seal structure can be spaced apart or abut as illustrated in FIG. 3 depicting a height of a surface of the substrate holder along a radius thereof. The seal structure 23 comprises a pair of concentric walls 23a, 23b which project upwardly from the upper surface 20a of substrate holder WT (see FIG. 4 which is an enlargement of a part of the graph of FIG. 3). A small gap remains between the upper seal surfaces of walls 23a, 23b, e.g. about 3 to 10 µm. The purpose of seal structure 23 is two-fold. Firstly, if a vacuum clamp is used to hold the substrate W to substrate holder WT, then the seal structure reduces the gas flow into the space below the substrate W and therefore reduces the energy requirement to maintain the under-pressure. Secondly, in an immersion lithographic apparatus, the seal structure 23 can also function to reduce ingress of immersion liquid into the space below the substrate W. The seal structure need not have two walls, in some cases a single wall will suffice. In an embodiment of the invention, the seal structure is omitted.

A plurality of through-holes 24 are provided in a central region of substrate holder WT. Through-holes 24 can fulfil two functions. Firstly they allow e-pins (not shown) to project through substrate holder WT to receive substrate W. Secondly, they allow the space between the substrate W and substrate holder WT to be connected to an under-pressure so as to effect a vacuum clamp as described above. The number and dispositions of the through-holes 24 can be varied as required to fulfil the above functions, in particular depending on whether separate holes are used for the e-pins and for connection to the under-pressure.

In an embodiment, a burl 21 has a height in the range of from 100 µm to 500 µm, e.g. about 150 µm. The diameter of the distal end surface of burl 21 may be in the range of 100 µm to 300 µm, e.g. about 200 µm. The pitch of the burls, i.e. the distance between the centers of two adjacent burls, may be in the range of about 0.5 mm to 3 mm, e.g. about 1.5 mm. In an embodiment, the total area of the distal end surfaces of all the burls 21 is in the range of from 1% to 3% of the total area of a substrate W or the substrate holder WT. Burls 21 may be frusto-conical in shape, with side walls being slightly inclined. In an embodiment, the side walls may be vertical or even overhanging if that is more convenient to manufacture. In an embodiment, burls 21 are circular in plan. Burls 21 can also be formed in other shapes if desired. Burls 21 may be treated, e.g. provided with a coating or structure, to reduce friction and/or increase resistance to wear.

Burls 21 are provided across substantially the whole area of main body upper surface 20a, right up to the seal structure 23. Burls 21 are provided on top of flow control structure upper surface 20a. In an embodiment the pattern of burls 21 is substantially uniform across the whole area of upper surface 20a, i.e. the buds have a uniform pitch. In an embodiment, the pattern of buds 21 varies in at least some parts of the upper surface 20a, for example in the vicinity of through-holes 24 or the edge of the wafer. The pattern of burls can be varied in order to control parameters of the support of the substrate, e.g. the local stiffness of the substrate holder as experienced by the substrate and/or friction between the substrate and the substrate holder.

Figure 4:
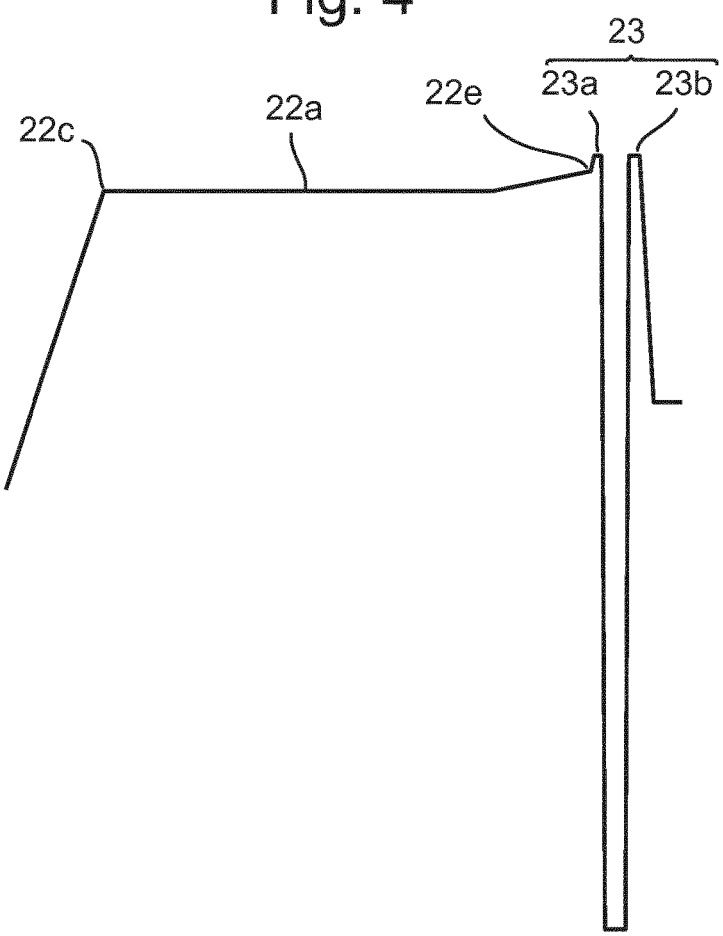
FIG. 4 is an enlargement of a part of the graph of FIG. 3.

Flow control structure 22 comprises a raised area on the main body upper surface 20a of substrate holder WT in a peripheral region thereof. The contour of flow control structure 22 is shown in FIG. 3 which is a graph of height relative to the support plane SP as a function of radial position. FIG. 4 is an enlarged view of part of the graph of FIG. 3 to better illustrate the shape of the flow control structure and seal structure. In FIG. 4 the horizontal axis is enlarged more than the vertical axis. It is important to note two things about FIGS. 3 and 4. Firstly, the horizontal axis (r) and vertical axis (z) are shown in arbitrary units but have very different scales. The arbitrary units for z are about a factor of 1000 smaller than the arbitrary units for r. Secondly, the burls, all of whose distal ends conform to the support plane SP, have been omitted from this drawing to avoid obscuring the form of the flow control structure.

From a functional point of view, the most important part of the flow control structure 22 is upper flow control surface 22a. Upper flow control surface 22a is substantially planar and disposed parallel to the support plane SP. The distance between upper flow control surface 22a and support plane SP is in the range of from about 3 or 10 µm to about 50 µm, e.g. 20 µm. In an embodiment, upper flow control surface is lower than the top of seal structure 23. In an embodiment, upper flow control surface 22a is concave, e.g. conforming to part of the surface of a torus. In an embodiment, upper flow control surface 22a is not parallel to the support plane SP. In an embodiment, upper flow control surface 22a is inclined so that the gap between upper flow control surface 22a and support plane SP increases with increasing radius. In an embodiment, upper flow control surface 22a is inclined so that the gap between upper flow control surface 22a and support plane SP decreases with increasing radius. The function of the upper flow control surface 22a is to create a gas cushion, i.e. a pressure buildup, as a substrate being lowered onto substrate holder WT gets close to the support plane.

As a substrate is lowered onto substrate holder WT, gas that is present between substrate W and substrate holder WT is compressed and if it cannot escape quickly enough, a pressure buildup occurs. Gas can escape from the space between the descending substrate W and substrate holder WT via two routes: through through-holes 24 in the substrate holder WT or between the gap between the seal structure 23 and the substrate W around the periphery of the substrate holder. As the substrate W descends, this gap reduces so that the rate of gas outflow by this route is reduced. By activating a vacuum pump or other source of under pressure and connecting it to through-holes 24, gas can be extracted from the space between the descending substrate W and substrate holder WT fast enough to prevent a pressure buildup that would otherwise limit the speed at which the substrate could be lowered onto the substrate holder and so prevent a negative impact on throughput.

In an embodiment of the present invention, the presence of the flow control structure causes a localized pressure buildup in the peripheral region of the substrate holder when the substrate W is being lowered onto the substrate holder. This pressure buildup generates an upward force on the peripheral region of the substrate W thus tending to deflect the edges of the substrate W upwards. The parameters of the flow control structure 22—in particular its width in the radial direction, its spacing from the support plane SP and its shape—can be selected to provide a desired effect on the periphery of a descending substrate. The parameters of the flow control structure can be selected to provide a desired compromise between deflection of the substrate edges and delay in loading substrates.

Flow control structure 22 also includes an incline section 22b joining the upper flow control surface 22a to the main body upper surface 21a of substrate holder WT. The shape of incline section 22b as well as corners 22c and 22d, which join incline section 22b to the upper flow control surface 22a, are not critical to the functioning of the flow control structure and can therefore be chosen as desired for ease of manufacture. Inclined section can be concave or convex. A stepped reduction in height of the raised area is also possible. Similarly, the exact form of corner 22e which joins upper flow control surface 22a to wall 23a can be chosen as desired for manufacturing reasons.

Substrate holder WT can be made of SiSiC or other ceramic materials. The burls, flow control structure and seal structure can be formed on the main body 20 by conventional techniques. For example, the substrate holder is made by removing material, e.g. using electric discharge machining, from a blank. A final lapping process can be used to ensure that the burls are of the correct heights. The conventional electric discharge machining process can be modified to leave additional material where required to form the flow control structure. However, the flow control structure is not required to have any particular structural properties and its dimensional tolerances are not particularly strict. Therefore, a flow control structure could be formed by addition of material to an existing substrate holder, e.g. by an additive manufacturing technique such as 3D printing. A flow control structure can be retrofitted to an existing substrate holder.

Investigations by the present inventors show that a substrate holder according to an embodiment of the present invention provides an improved behavior of loaded substrates, in particular a more consistent behavior between different types of distorted substrate. This is illustrated in FIGS. 5 to 8.

Figure 5:
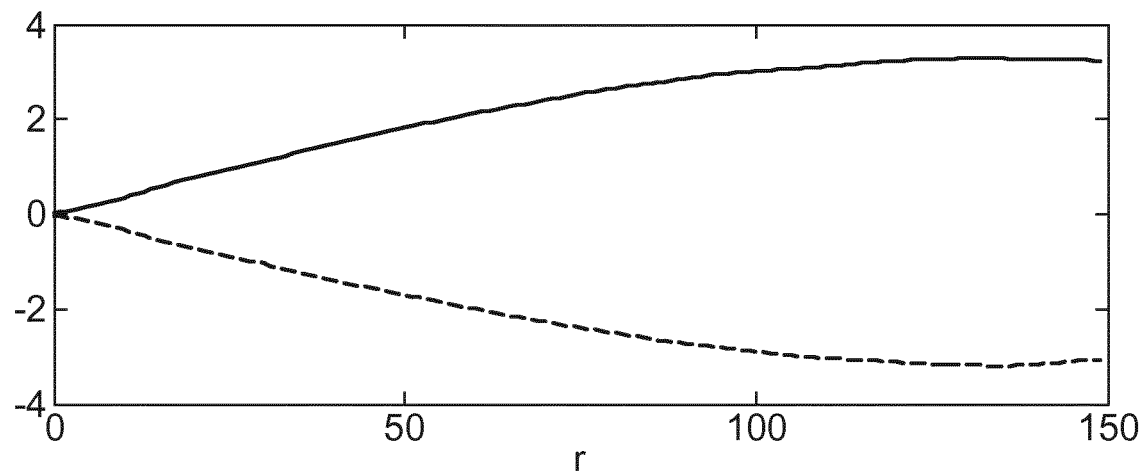
FIG. 5 is a graph depicting distortion occurring in two different types of substrate when held on a conventional substrate holder.
Figure 6:
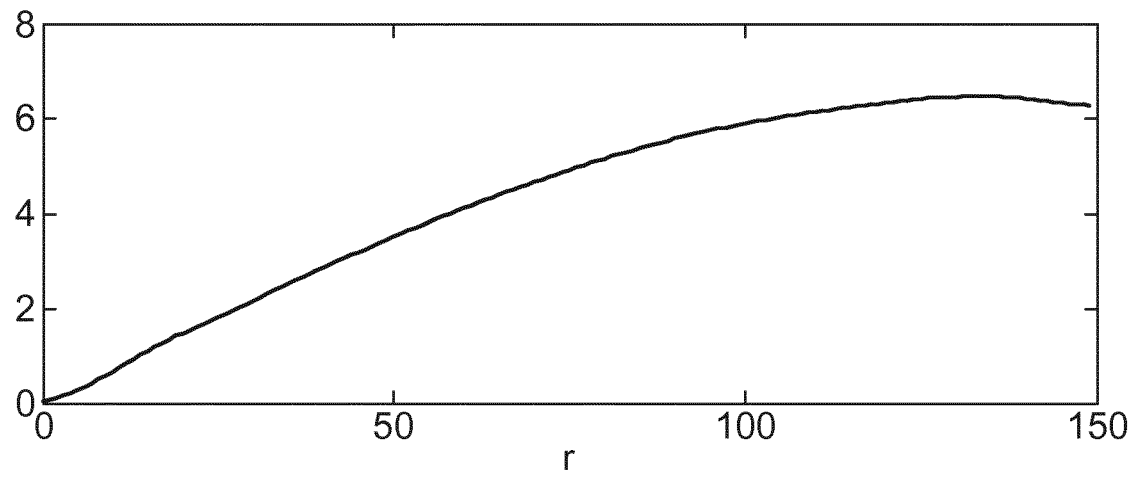
FIG. 6 is a graph depicting the substrate-to-substrate distortion occurring in two different types of substrate when held on a conventional substrate holder.

FIG. 5 depicts in-plane deformation in arbitrary units (vertical axis) as a function of radius in arbitrary units (horizontal axis) for an initially flat substrate (continuous line) and an initially umbrella-distorted substrate. It will be seen that the flat substrate experiences a positive in-plane deformation, i.e. an expansion, whilst the umbrella substrate experiences a negative in-plane deformation, i.e. a compression. FIG. 6 shows the substrate-to-substrate variation, i.e. the difference between the deformation of the flat substrate and the deformation of the umbrella substrate. Because the flat substrates and umbrella substrates deform in different ways, the substrate to substrate variation is greater than the deformation experienced by any individual substrate.

Figure 7:
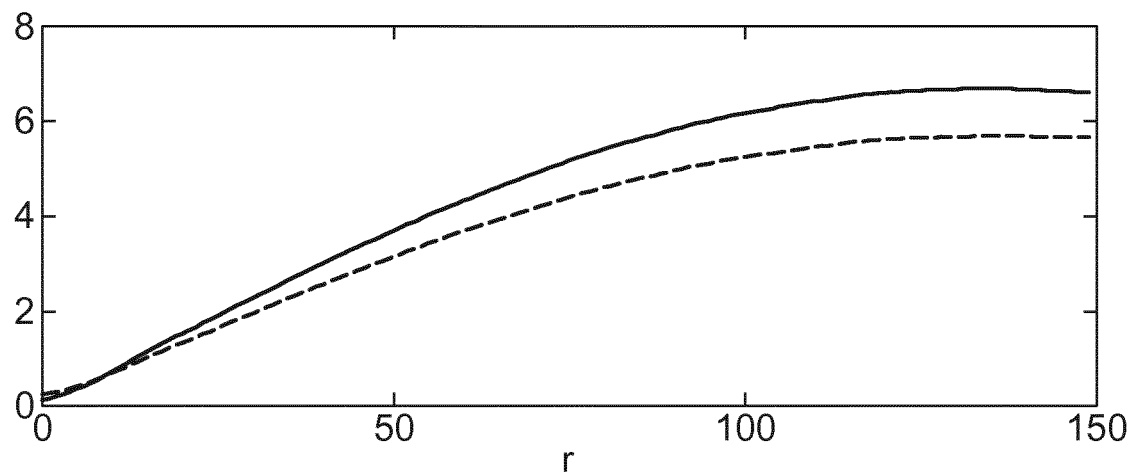
FIG. 7 is a graph depicting distortion occurring in two different types of substrate when held on a substrate holder according to an embodiment.
Figure 8:
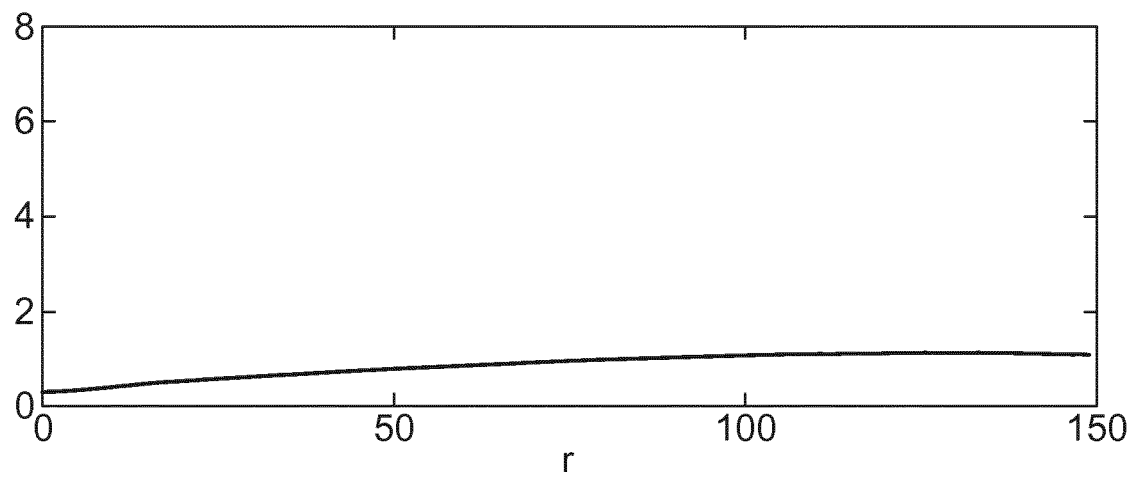
FIG. 8 is a graph depicting the substrate-to-substrate distortion occurring in two different types of substrate when held on a substrate holder according to an embodiment.

FIGS. 7 and 8 are corresponding graphs to FIGS. 5 and 6 but using a substrate holder according to an embodiment of the present invention. The same arbitrary units for in-plane deformation are used. It will be seen from FIG. 7 that both the flat substrate (continuous line) and umbrella-substrate (dash line) experience a positive in-plane deformation, i.e. an expansion. Although the in-plane deformation experienced by the flat substrate is greater when using a substrate holder according to an embodiment of the invention than when using a conventional substrate holder, it can be seen from FIG. 8 that the substrate-to-substrate variation is reduced substantially. Thus, it will be understood that a substrate holder according to an embodiment of the invention gives rise to much more consistent behavior between different types of distorted substrate. Consistent deformation can be compensated for elsewhere in the exposure process, e.g. by adjusting positioning set points for the substrate during exposure. It might be thought that different substrate holders could be used for different types of distorted substrates to minimize deformation but substrate holders cannot be exchanged so readily.

Although the present invention has been described in relation to an exemplary embodiment that employs a vacuum clamping system, an electrostatic clamp can also be used. The present invention can be employed in a lithographic apparatus in which the beam path is under high vacuum conditions, e.g. an EUV lithographic apparatus, if the substrate is loaded onto the substrate holder in an environment having sufficient gas pressure to enable a gas cushion to be formed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A substrate holder for use in a lithographic apparatus and configured to support a substrate, the substrate holder comprising:
   a main body having a main body surface;
   a plurality of burls projecting from the main body surface; wherein
   each burl has a distal end configured to engage with the substrate;
   the distal ends of the burls substantially conform to a support plane whereby a substrate can be supported in a substantially flat state on the burls;
   a flow control structure configured to form a gas cushion adjacent the periphery of the substrate holder when a substrate is being lowered onto the substrate holder, wherein the flow control structure comprises a raised area at a height closer to the main body surface than the support plane and disposed adjacent a periphery of the substrate holder and wherein the raised area has a distal surface that is one of inclined relative to the support plane, or has a concave surface; and
   a seal structure that is provided radially outward of the flow control structure, wherein the seal structure is configured to reduce gas flow into a space below the substrate to thereby reduce an amount of energy required to maintain an under-pressure.

2. The substrate holder of claim 1, wherein the raised area comprises a ring around substantially the whole periphery of the substrate holder.

3. The substrate holder of claim 1, wherein the raised area has a width in a radial direction of the substrate holder in the range of from 3 mm to 80 mm.

4. The substrate holder of claim 3, wherein the raised area has a width in a radial direction of the substrate holder in the range of from 10 mm to 50 mm.

5. The substrate holder of claim 1, wherein a distance between the distal surface and the support plane is between about 3 μm and about 10 μm.

6. The substrate holder of claim 1, wherein a distance between the distal surface and the support plane is no more than 50 μm.

7. The substrate holder of claim 1, further comprising a plurality of through holes in a central region of the substrate holder.

8. The substrate holder of claim 1, wherein a distance between a distal seal surface of the seal structure and the support plane is less than a distance between the distal surface of the flow control structure and the support plane.

9. A lithographic apparatus for projecting an image onto a substrate, the lithographic apparatus comprising:
   a substrate holder according to claim 1; and
   a clamp system for clamping a substrate to the substrate holder.

10. A method of manufacturing devices using a lithographic apparatus of claim 9, the method comprising:
    loading a substrate onto the substrate holder;
    engaging the clamp system; and
    exposing a pattern onto the substrate.

11. The substrate holder of claim 1, wherein the seal structure comprises a pair of concentric walls that project upwardly from an upper surface of the substrate holder, wherein a small gap of about 3 to 10 μm exists between upper seal surfaces of the pair of walls.

12. The substrate holder of claim 1, wherein the seal structure is further configured to reduce ingress of an immersion liquid into the space below the substrate.

* * * * *